(12) United States Patent
Cha et al.

(10) Patent No.: US 7,585,787 B2
(45) Date of Patent: Sep. 8, 2009

(54) SEMICONDUCTOR MEMORY DEVICE AND METHOD OF MANUFACTURING THE SAME

(75) Inventors: Tae-Ho Cha, Seongnam-si (KR); Gil-Heyun Choi, Seoul (KR); Byung-Hee Kim, Seoul (KR); Hee-Sook Park, Seoul (KR); Jang-Hee Lee, Yongin-si (KR); Geum-Jung Seong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 11/648,595

(22) Filed: Jan. 3, 2007

(65) Prior Publication Data

US 2008/0079056 A1    Apr. 3, 2008

(30) Foreign Application Priority Data

Sep. 29, 2006    (KR) .................... 10-2006-0095515

(51) Int. Cl.
*H01L 21/469* (2006.01)
(52) U.S. Cl. .................. 438/785; 257/E21.679
(58) Field of Classification Search .......... 438/197, 438/785; 257/E21.646, E21.66, E21.661, 257/E21.679, E21.689
See application file for complete search history.

(56) References Cited

U.S. PATENT DOCUMENTS

2005/0088889 A1*  4/2005  Lee et al. .................. 365/202
2006/0057794 A1*  3/2006  Youn et al. ................ 438/197
2006/0289920 A1* 12/2006  Wu et al. .................. 257/310

FOREIGN PATENT DOCUMENTS

| JP | 2004-221448 | 8/2004 |
| KR | 10-2004-0095796 | 11/2004 |
| KR | 0578131 | 5/2006 |

OTHER PUBLICATIONS

Quirk, M, Semiconductor Manufacturing Technology, Prentice Hall, 2001, pp. 310.*
Jerzy, R, Semiconductor Glossary, Multimedia Prosto Publishing, 2004, pp. 139.*

* cited by examiner

*Primary Examiner*—W. David Coleman
*Assistant Examiner*—Latanya Crawford
(74) *Attorney, Agent, or Firm*—Harness, Dickey & Pierce, P.L.C.

(57) ABSTRACT

A semiconductor memory device, e.g., a charge trapping type non-volatile memory device, may include a charge trapping structure formed in a first area of a substrate and a gate structure formed in a second area of the substrate. The charge trapping structure may include a tunnel oxide layer pattern, a charge trapping layer pattern and a dielectric layer pattern of aluminum-containing tertiary metal oxide. The gate structure may include a gate oxide layer pattern, a polysilicon layer pattern and an ohmic layer pattern of aluminum-containing tertiary metal silicide. A first electrode and a second electrode may be formed on the charge trapping structure. A lower electrode and an upper electrode may be provided on the gate structure. The dielectric layer pattern may have a higher dielectric constant, and the ohmic layer pattern may have improved thermal stability, thereby enhancing programming and erasing operations of the charge trapping type non-volatile memory device.

14 Claims, 7 Drawing Sheets

SEMICONDUCTOR MEMORY DEVICE AND METHOD OF MANUFACTURING THE SAME

PRIORITY STATEMENT

This application claims priority under 35 USC § 119 to Korean Patent Application No. 2006-95515, filed on Sep. 29, 2006, in the Korean Intellectual Property Office (KIPO), the entire contents of which are incorporated herein by reference.

BACKGROUND

1. Field

Example embodiments relate to semiconductor memory devices and methods of manufacturing the semiconductor memory devices. Other example embodiments relate to charge trapping type non-volatile memory devices having charge trapping layer patterns for storing charges therein, and methods of manufacturing the charge trapping type non-volatile memory devices.

2. Description of the Related Art

Generally, non-volatile semiconductor memory devices may be divided into floating gate type non-volatile memory devices and charge trapping type non-volatile memory devices in accordance with structures of unit memory cells thereof. The charge trapping type memory device may have a silicon oxide nitride oxide semiconductor (SONOS) structure, and thus the charge trapping type memory device may be referred to as an SONOS type non-volatile memory device. In the floating gate type memory device, the unit memory cell may include a tunnel oxide layer formed on a semiconductor substrate, a floating gate, a dielectric layer and a control gate. Data may be stored into the floating gate as free charges are injected into the floating gate.

In the charge trapping type non-volatile memory device, the unit memory cell may include a tunnel oxide layer formed on the semiconductor substrate, a charge trapping layer, a dielectric layer and an electrode. Data may be stored into the charge trapping non-volatile memory device as charges are injected into charge trapping sites of the charge trapping layer. The charges may be trapped in deeper level trapping sites of the charge trapping layer such that the tunnel oxide layer may have a relatively thin thickness. When the tunnel oxide layer is relatively thin, the charge trapping type non-volatile memory device may be operated with a decreased voltage and also a peripheral circuit of the charge trapping type non-volatile memory device may have a simpler structure. The charge trapping type non-volatile memory device may be highly integrated in comparison with the floating gate type non-volatile memory device.

As for the conventional charge trapping type non-volatile memory device, a charge trapping structure of a cell transistor in a cell area may be different from a gate structure of a metal oxide semiconductor (MOS) transistor in a peripheral circuit area, so that manufacturing processes for forming the charge trapping structure and the gate structures may be somewhat complicated. A recent charge trapping type non-volatile memory device may include a metal oxide layer having a high-k dielectric constant as a dielectric layer instead of a conventionally used silicon oxide layer. An electrode of doped polysilicon may not be properly formed on the dielectric layer of metal oxide, because the electrode of the doped polysilicon on the metal oxide layer may not have a sufficient work function due to Fermi-level pinning phenomenon. The electrode on the metal oxide layer may be formed using a conductive material having an increased work function above about 4.5 eV. A gate electrode of the MOS transistor in the peripheral circuit area may be formed using a conductive material that may have a decreased work function of about 4.0 eV to about 4.3 eV To form the electrode in the cell area and the gate electrode in the peripheral circuit area, different conductive materials may be deposited on the cell and the peripheral circuit areas through separated deposition processes, and also the deposited different conductive materials may be respectively etched by separated etching processes. Manufacturing processes for forming the charge trapping structure and the gate structure may be complicated, thereby causing failures in the manufacturing processes. Because additional electrodes are formed on the electrode and the gate electrode, respectively, barrier metal layers may be required between the electrode and one additional electrode and between the gate electrode and another additional electrode. The barrier metal layers may not be easily formed between the electrode and one additional electrode and between the gate electrode and the other additional electrode because the barrier metal layers may be required to have improved thermal stability and a proper diffusion barrier.

SUMMARY

Example embodiments provide a semiconductor memory device, e.g., a charge trapping type non-volatile memory device, including a dielectric layer pattern of aluminum-containing tertiary metal oxide and an ohmic layer pattern of aluminum-containing tertiary metal silicide so as to ensure improved electrical characteristics and enhanced operations.

Example embodiments provide a method of manufacturing the semiconductor device, e.g., the charge trapping type non-volatile memory device, having a dielectric layer pattern of aluminum-containing tertiary metal oxide and an ohmic layer pattern of aluminum-containing tertiary metal silicide, to thereby ensure improved electrical characteristics and enhanced operations.

According to example embodiments, there may be provided a semiconductor device, e.g., a charge trapping type non-volatile memory device, including a charge trapping structure, a first electrode, a gate structure and a lower electrode. The charge trapping structure may be formed in a first area of a substrate. The charge trapping structure may include a tunnel oxide layer pattern, a charge trapping layer pattern and a dielectric layer pattern including an aluminum-containing tertiary metal oxide. The first electrode may be formed on the charge trapping structure. The gate structure may be formed in a second area of the substrate. The gate structure may include a gate oxide layer pattern, a polysilicon layer pattern and an ohmic layer pattern including an aluminum-containing tertiary metal silicide. The lower electrode may be formed on the gate structure.

In example embodiments, the aluminum-containing tertiary metal oxide may include tantalum aluminum oxide, titanium aluminum oxide, zirconium aluminum oxide and/or hafnium aluminum oxide. These may be used alone and/or in a mixture thereof. In example embodiments, the aluminum-containing tertiary metal silicide may include tantalum aluminum silicide, titanium aluminum silicide, zirconium aluminum silicide and/or hafnium aluminum silicide. These may be used alone and/or in a mixture thereof.

In example embodiments, the first electrode and the lower electrode may include aluminum-containing tertiary metal nitrides. For example, the first electrode and the lower electrode may include tantalum aluminum nitride, titanium aluminum nitride, zirconium aluminum nitride and/or hafnium aluminum nitride. These may be used alone and/or in a mixture thereof. In example embodiments, a metal in the first electrode may be substantially the same as that in the dielectric layer pattern. A metal in the lower electrode may be substantially the same as that in the ohmic layer pattern.

In example embodiments, a second electrode may be formed on the first electrode, and an upper electrode may be formed on the lower electrode. In example embodiments, the second electrode and the upper electrode may include materials that have resistances substantially lower than those of the first electrode and the lower electrode, respectively. For example, the second electrode and the upper electrode may include tungsten. In example embodiments, first impurity regions may be formed on portions of the first area, and second impurity regions may be formed on portions of the second area.

According to example embodiments, there may be provided a method of manufacturing a semiconductor device, e.g., a charge trapping type non-volatile memory device. In the method of manufacturing the charge trapping type non-volatile memory device, a preliminary tunnel oxide layer pattern, a preliminary charge trapping layer pattern and a silicon oxide layer pattern may be sequentially formed in a first area of a substrate. A preliminary gate oxide layer pattern and a preliminary polysilicon layer pattern may be successively formed in a second area of the substrate. An aluminum-containing metal compound layer may be formed on the silicon oxide layer pattern and the preliminary polysilicon layer pattern. An electrode layer may be formed on the aluminum-containing metal compound layer. An aluminum-containing tertiary metal oxide layer may be formed between the preliminary charge trapping layer pattern and the electrode layer by reacting the aluminum-containing metal compound layer with the silicon oxide layer pattern. An aluminum-containing tertiary metal silicide layer may be formed between the preliminary polysilicon layer pattern and the electrode layer by reacting the aluminum-containing metal compound layer with the preliminary polysilicon layer pattern. A charge trapping structure and a first electrode may be formed in the first area by patterning a first portion of the electrode layer, the tertiary metal oxide layer, the preliminary charge trapping layer pattern and the preliminary tunnel oxide layer pattern. The charge trapping structure may include a tunnel oxide layer pattern, a charge trapping layer pattern and a dielectric layer pattern. A gate structure and a lower electrode may be formed in the second area by patterning a second portion of the electrode layer, the tertiary metal silicide layer, the preliminary polysilicon layer pattern and the preliminary gate oxide layer pattern. The gate structure may include a gate oxide layer pattern, a polysilicon layer pattern and an ohmic layer pattern.

In example embodiments, the silicon oxide layer pattern may have a thickness of about 10 Å to about 1,000 Å. In example embodiments, the aluminum-containing metal compound layer may include a tantalum aluminum compound, a titanium aluminum compound, a zirconium aluminum compound and/or a hafnium aluminum compound. These may be used alone and/or in a mixture thereof. In example embodiments, the aluminum-containing metal compound layer may have a thickness of about 10 Å to about 1,000 Å. In example embodiments, forming the aluminum-containing metal compound layer and forming the electrode layer may be carried out in-situ.

In example embodiments, the aluminum-containing metal compound layer may be formed by a physical vapor deposition (PVD) process. In example embodiments, the electrode layer may include an aluminum-containing metal nitride. For example, the electrode layer may include tantalum aluminum nitride, titanium aluminum nitride, zirconium aluminum nitride or hafnium aluminum nitride. These may be used alone and/or in a mixture thereof. In example embodiments, the electrode layer may be formed using a target including an aluminum-containing metal compound and a nitrogen-containing gas under a plasma atmosphere.

In example embodiments, the aluminum-containing tertiary metal oxide layer and the aluminum-containing tertiary metal silicide layer may be simultaneously formed. In example embodiments, the aluminum-containing tertiary metal oxide layer and the aluminum-containing tertiary metal silicide layer may be formed by a thermal treatment at a temperature of about 700° C. to about 1,000° C. In example embodiments, an additional electrode layer may be formed on the first electrode and the lower electrode using a metal that has a resistance substantially lower than that of the electrode layer. A second electrode and an upper electrode may be formed on the first electrode and the lower electrode by patterning the additional electrode layer.

In example embodiments, the additional electrode layer may include tungsten. In example embodiments, first impurity regions may be formed on portions of the first area adjacent to the charge trapping structure. Second impurity regions may be formed on portions of the second area adjacent to the gate structure.

According to example embodiments, a dielectric layer pattern of a charge trapping structure in a cell area may be simultaneously formed with an ohmic layer pattern of a gate structure in a peripheral circuit area. The dielectric layer pattern of an aluminum-containing tertiary metal oxide may have a higher dielectric constant, and also the ohmic layer pattern of an aluminum-containing tertiary metal silicide may have improved thermal stability, thereby enhancing programming and erasing operations of a charge trapping type non-volatile memory device.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DESCRIPTION OF EXAMPLE EMBODIMENTS

Example embodiments are described more fully hereinafter with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers, patterns and regions may be exaggerated for clarity.

It will be understood that when an element or a layer is referred to as being "on," "connected to" or "coupled to"

another element or another layer, it can be directly on, connected or coupled to the other element, the other layer or intervening elements or layers may be present. In contrast, when an element is referred to as being "directly on," "directly connected to" or "directly coupled to" another element or another layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, patterns, layers and/or sections, these elements, components, regions, patterns, layers and/or sections should not be limited by these terms. These terms are only used to distinguish one element, component, region, pattern, layer or section from another region, layer or section. Thus, a first element, component, region, pattern, layer or section discussed below could be termed a second element, component, region, pattern, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
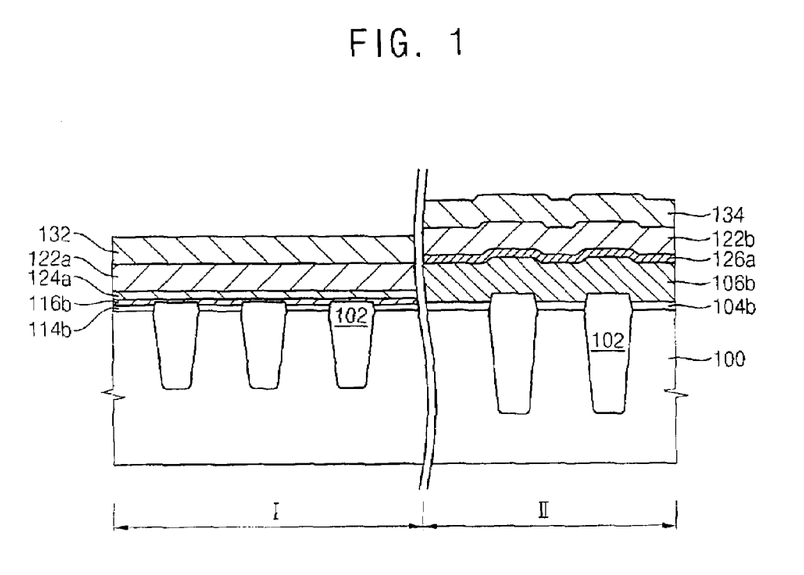
FIGS. 1 and 2 are diagrams illustrating a charge trapping type non-volatile memory device in accordance with example embodiments.
Figure 2:
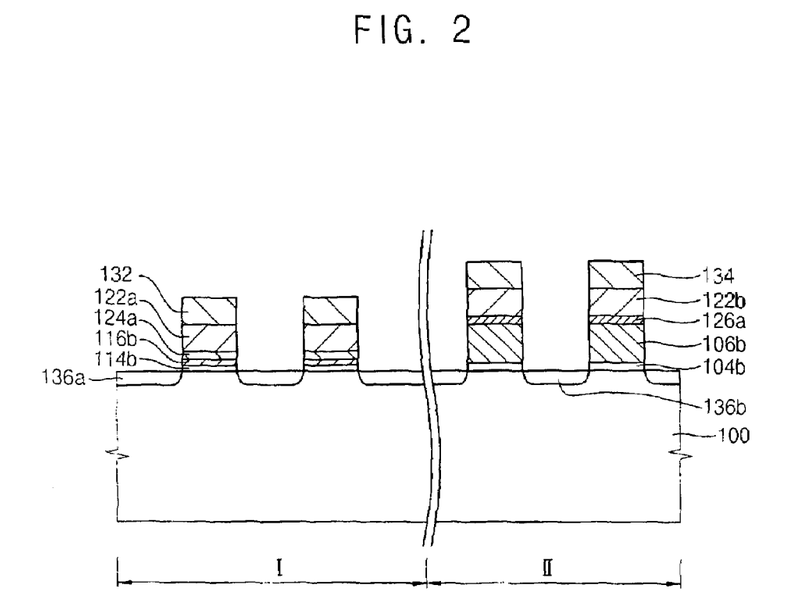

FIGS. 1 and 2 are diagrams illustrating a semiconductor memory device in accordance with example embodiments. Although FIGS. 1 and 2 illustrate a charge trapping type non-volatile memory device, the feature of example embodiments may be employed for a floating gate type non-volatile memory device and/or a volatile semiconductor device, e.g., a dynamic random access memory (DRAM) device and/or a static random access memory (SRAM) device. FIG. 1 illustrates the charge trapping type non-volatile memory device along a first direction, whereas FIG. 2 illustrates the charge trapping type non-volatile memory device in a second direction substantially perpendicular to the first direction. For example, the first direction may be perpendicular to an active region of the charge trapping type non-volatile memory device, and the second direction may be parallel with the active region of the charge trapping type non-volatile memory device.

Referring to FIGS. 1 and 2, a semiconductor substrate 100 may be provided. The semiconductor substrate 100 may include a silicon substrate, a silicon-on-insulator (SOI) substrate, a germanium substrate, a germanium-on-insulator (GOI) substrate and/or a silicon-germanium substrate. Alternatively, the semiconductor substrate 100 may include a thin silicon epitaxial substrate formed by a selective epitaxial growth (SEG) process. In example embodiments, the semiconductor substrate 100 may include the silicon substrate.

The semiconductor substrate 100 may be divided into a first area I and a second area II. The first area I may correspond to a cell area on which unit memory cells of the charge trapping type non-volatile memory device may be formed. The second area II may correspond to a peripheral circuit area on which peripheral circuits may be positioned. An isolation layer pattern 102 may be formed on the semiconductor substrate 100 to define the active region and a field region. The isolation layer pattern 102 may be formed by an isolation process, e.g., a shallow trench isolation (STI) process.

In example embodiments, a first portion of the isolation layer pattern 102 in the first area I may have a thickness substantially different from that of a second portion of the isolation layer pattern 102 in the second area II. A cell transistor may be formed in the first area I of the semiconductor substrate 100, whereas a metal oxide semiconductor (MOS) transistor may be formed in the second area II of the semiconductor substrate 100. A charge trapping structure formed in the first area I of the semiconductor substrate 100 may include a tunnel oxide layer pattern 114b, a charge trapping layer pattern 116b and a dielectric layer pattern 124a.

The tunnel oxide layer pattern 114b may serve as an energy barrier with respect to tunneling of charges. The tunnel oxide layer pattern 114b may be formed using an oxide, e.g., silicon oxide and/or a nitride, for example, silicon nitride. In example embodiments, the tunnel oxide layer pattern 114a may be formed by a thermal oxidation process. When the tunnel oxide layer pattern 114a includes silicon oxide formed by the thermal oxidation process, the tunnel oxide layer pattern 114a may have an improved thermal, electrical and chemical stability, thereby suppressing defects from being generated while repeatedly performing programming and erasing operations of the charge trapping type non-volatile memory device.

The charge trapping layer pattern 116b may include charge trapping sites for storing the charges therein. To effectively store the charges in the charge trapping layer pattern 116b, a plurality of trap sites to trap the charges may be required. In example embodiments, the charge trapping layer pattern 116b may be formed using a nitride, e.g., silicon nitride. The dielectric layer pattern 124a may be formed using an aluminum-containing tertiary metal oxide including a refractory metal. For example, the dielectric layer pattern 124a may be formed using tantalum aluminum oxide, titanium aluminum oxide, zirconium aluminum oxide or hafnium aluminum oxide. These may be used alone and/or in a mixture thereof.

When the dielectric layer pattern 124a includes the aluminum-containing tertiary metal oxide, the dielectric layer pattern 124a may have a dielectric constant substantially higher than that of silicon oxide. Therefore, the charge trapping type non-volatile memory device may have enhanced data retention characteristics and rapid programming and erasing operation speeds in case that the charge trapping type non-volatile memory device may include the dielectric layer pattern 124a of the aluminum-containing tertiary metal oxide. A first electrode 122a may be formed on the dielectric layer pattern 124a. The first electrode 122a may be also formed using an aluminum-containing tertiary metal nitride.

In example embodiments, the first electrode 122a may have an increased work function of about 4.6 eV to about 5.2 eV. For example, the first electrode 122a may include tantalum aluminum nitride, titanium aluminum nitride, zirconium aluminum nitride or hafnium aluminum nitride. These may be used alone and/or in a mixture thereof. When the first electrode 122a has an increased work function, an energy wall between the dielectric layer pattern 124a and the first electrode 122a may increase. Therefore, the charges may not be reversely tunneled from the first electrode 122a to the charge trapping layer pattern 116b in the erasing operation of the charge trapping type non-volatile memory device.

A second electrode 132 may be formed on the first electrode 122a. The second electrode 132 may be formed using a material having a resistance substantially lower than that of the first electrode 122a. For example, the second electrode 132 may be formed using tungsten. When the second electrode 132 includes tungsten, a metal barrier layer of tungsten nitride may not be additionally formed between the first electrode 122a and the second electrode 132 because the first electrode 122a of the aluminum-containing tertiary metal nitride including aluminum may be thermally stable and effectively prevent or reduce diffusion of tungsten from the second electrode 132. The first electrode 122a may simultaneously serve as an electrode and a metal barrier layer.

First impurity regions 136a may be formed on portions of the first area I of the semiconductor substrate 100 adjacent to the charge trapping structure as shown in FIG. 2. The first impurity regions 136a may be formed by an ion implantation process. As described above, the cell transistor formed in the first area I may include the charge trapping structure and the first impurity regions 136a.

A gate structure may be formed in the second area II of the semiconductor substrate 100. The gate structure may include a gate oxide layer pattern 104b, a polysilicon layer pattern 106b and an ohmic layer pattern 126a. The gate oxide layer pattern 104b may be formed by a thermal oxidation process. The polysilicon layer pattern 106b may be doped with N-type impurities. The ohmic layer pattern 126a may be formed using an aluminum-containing tertiary metal silicide. For example, the ohmic layer pattern 126a may be formed using tantalum aluminum silicide, titanium aluminum silicide, zirconium aluminum silicide or hafnium aluminum silicide. These may be used alone and/or in a mixture thereof.

A lower electrode 122b may be formed on the ohmic layer pattern 126a. The lower electrode 122b may be formed using an aluminum-containing tertiary metal nitride. For example, the lower electrode 122b may be formed using tantalum aluminum nitride, titanium aluminum nitride, zirconium aluminum nitride or hafnium aluminum nitride. These may be used alone and/or in a mixture thereof. In example embodiments, the lower electrode 122b may be formed using the aluminum-containing tertiary metal nitride substantially the same as that of the first electrode 122a. In example embodiments, the first electrode 122a and the lower electrode 122b may be formed using different aluminum-containing tertiary metal nitrides. In example embodiments, the ohmic layer pattern 126a including the aluminum-containing tertiary metal silicide may be formed between the polysilicon layer pattern 106b and the lower electrode 122b so that the gate structure in the second area II may have a desirably reduced resistance.

An upper electrode 134 may be formed on the lower electrode 122b. The upper electrode 134 may be formed using a material that has a resistance substantially lower than that of the lower electrode 122b. The upper electrode 134 may include a material substantially the same as that of the second electrode 132. For example, the upper electrode 134 may be formed using a metal, e.g., tungsten. When the upper electrode 134 includes tungsten, a metal barrier layer may not be formed between the lower electrode 122b and the upper electrode 134 because the lower electrode 122b may selectively prevent or reduce diffusion of metal from the upper electrode 134. Second impurity regions 136b may be formed on portions of the second area II in the semiconductor substrate 100 adjacent to the gate structure as shown in FIG. 2. The second impurity regions 136b may be formed by an ion implantation process. The MOS transistor formed in the second area II may include the gate structure and the second impurity regions 136b. In example embodiments, the MOS transistor may have an N-type.

Figure 11:
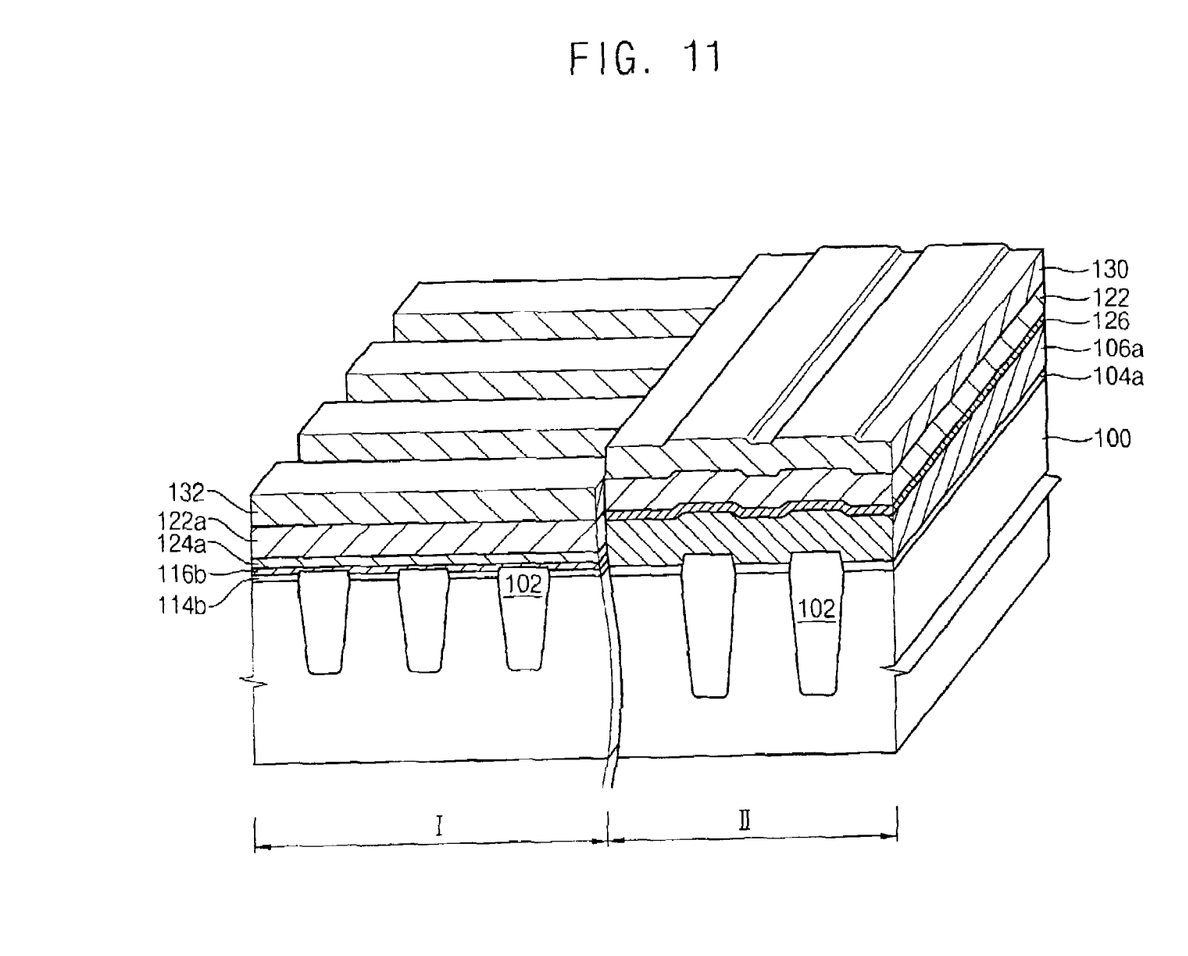
FIGS. 11 and 12 are diagrams illustrating the method of manufacturing the charge trapping type non-volatile memory device in accordance with example embodiments.
Figure 12:
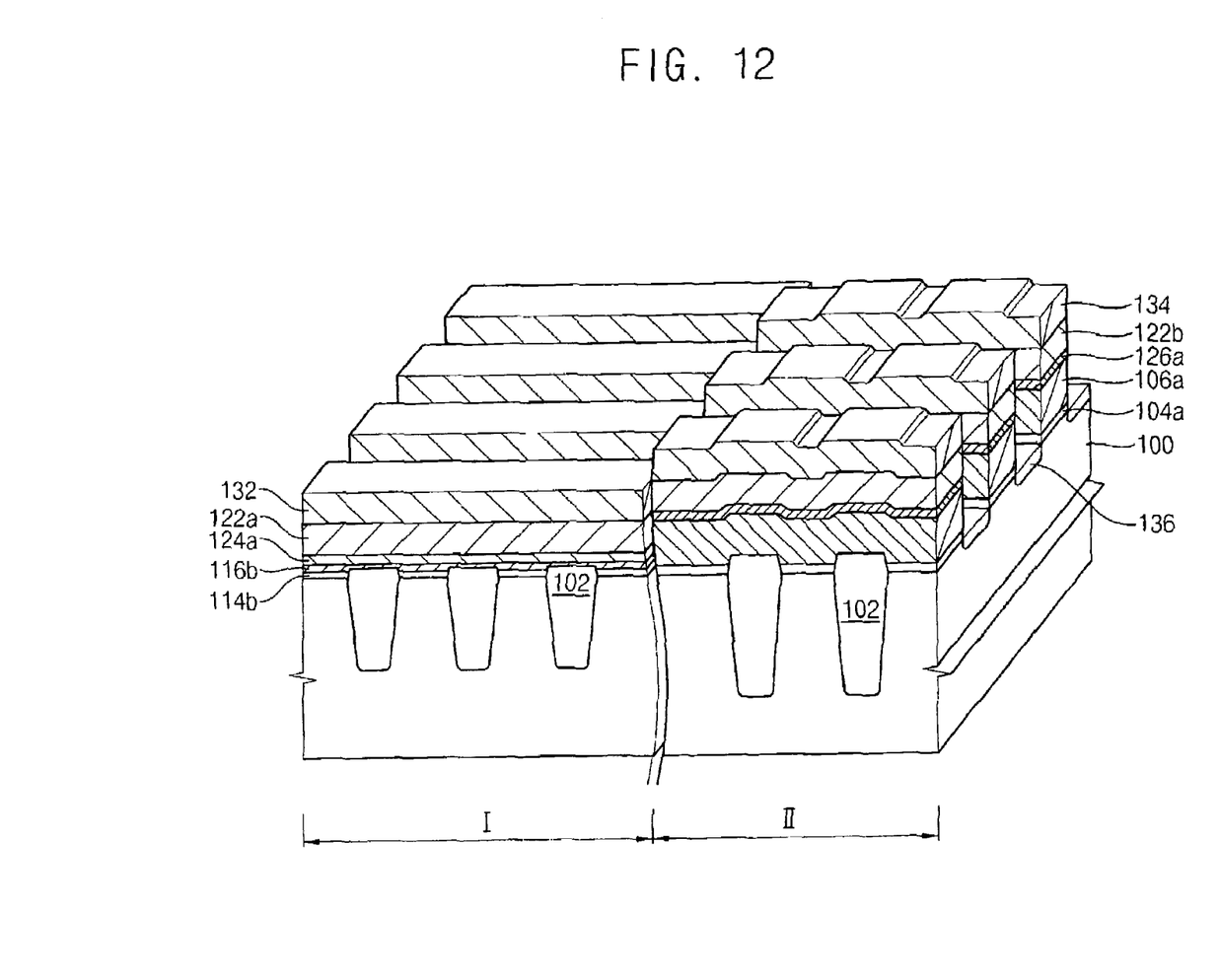

FIGS. 3 to 10 are diagrams illustrating a method of manufacturing a semiconductor memory device in accordance with example embodiments. FIGS. 11 and 12 are diagrams illustrating the method of forming the charge trapping type non-volatile memory device. Although FIGS. 3 to 12 illustrate a charge trapping type non-volatile memory device, the method described with reference to FIGS. 3 to 12 may be advantageously employed in manufacturing a floating gate type non-volatile memory device and/or a volatile semiconductor device, e.g., a DRAM device and/or an SRAM device.

Figure 3:
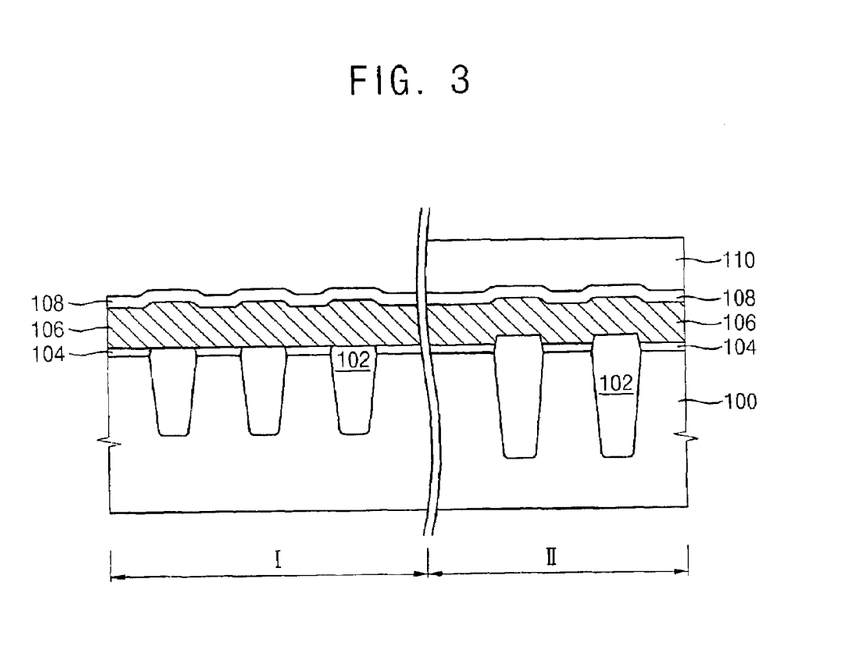
FIGS. 3 to 10 are diagrams illustrating a method of manufacturing a charge trapping type non-volatile memory device in accordance with example embodiments.

Referring to FIG. 3, a semiconductor substrate 100 may be divided into a first area I and a second area II. The first and the second areas I and II may correspond to a cell area and a peripheral circuit area, respectively. Unit memory cells of the charge trapping type non-volatile memory device may be formed in the first area I, whereas peripheral circuits of the charge trapping type non-volatile memory device may be formed in the second area II. Isolation layer patterns 102 may be formed in the first and the second areas I and II of the semiconductor substrate 100. Some isolation layer patterns 102 in the first area I may have line shapes extending along a first direction on the substrate 100. Some isolation layer patterns 102 in the first area I may have heights substantially different from those of other isolation layer patterns 102 in the second area II. The isolation layer patterns 102 define active regions and field regions of the substrate 100.

A first silicon oxide layer 104 may be formed on the substrate 100 having the isolation layer patterns 102. The first silicon oxide layer 104 may serve as a gate oxide layer of a MOS transistor formed in the second area II of the substrate 100. The MOS transistor in the second area II may have an N-type. The first silicon oxide layer 104 may be formed by a thermal oxidation process. A polysilicon layer 106 may be formed on the first silicon oxide layer 104. The polysilicon layer 106 may be formed by a low pressure chemical vapor deposition (LPCVD) process. In example embodiments, N-type impurities may be doped in the polysilicon layer 106. A hard mask layer 108 may be formed on the polysilicon layer 106. The hard mask layer 108 may be formed using an oxide, e.g., middle temperature oxide (MTO). The hard mask layer 108 may be formed at a temperature of about 700° C. to about 750° C. A first photoresist pattern 110 may be formed on the hard mask layer 108. The first photoresist pattern 110 may expose the first area I of the substrate 100.

Figure 4:
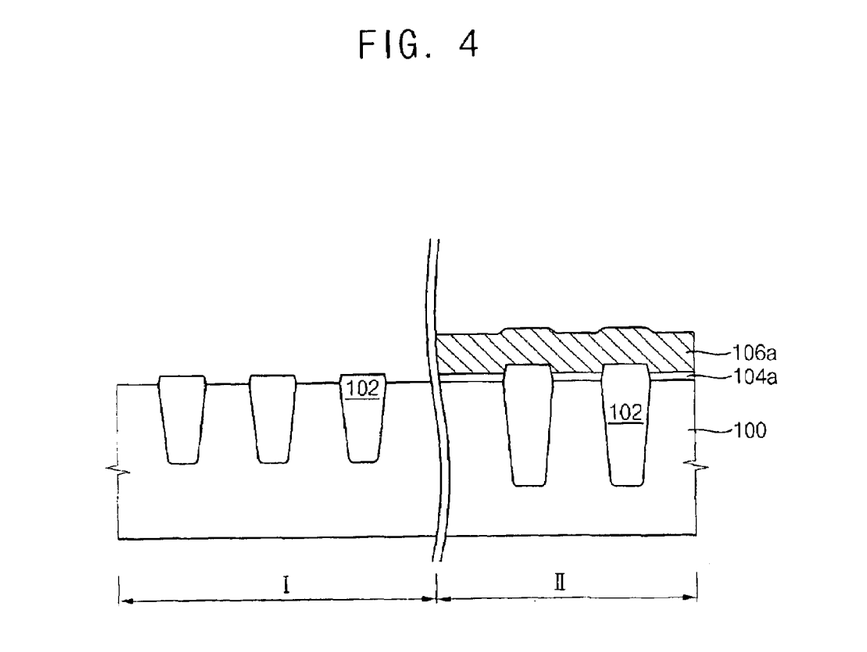

Referring to FIG. 4, the hard mask layer 108 may be partially etched using the first photoresist pattern 110 as an etching mask so that a first hard mask (not shown) may be formed in the second area II. The first photoresist pattern 110 may be removed from the first hard mask by an ashing process and/or a stripping process. Using the first hard mask as an etching mask, a portion of the polysilicon layer 106 in the first area I may be etched to form a preliminary polysilicon layer 106a in the second area II. A portion of the first silicon oxide layer 104 in the first area I may be etched to form a preliminary gate oxide layer pattern 104a in the second area II of the substrate 100. To prevent or reduce damage to the substrate 100 when forming the preliminary gate oxide layer pattern 104a, the first silicon layer 104 may be partially etched by a wet etching process.

In example embodiments, the first hard mask may be etched together with the portion of the first silicon layer 104 because the first hard mask and the first silicon oxide layer 104 may include oxides, respectively. After removing the first hard mask, the preliminary gate oxide layer pattern 104a and the preliminary polysilicon layer pattern 106a may be sequentially formed in the second area II of the substrate 100.

Figure 5:
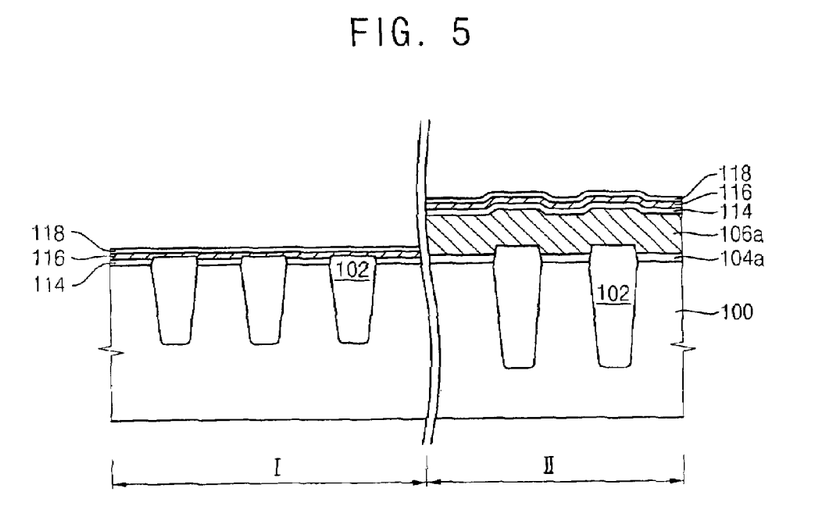

Referring to FIG. 5, a tunnel oxide layer 114 may be formed on the substrate 100 and the preliminary polysilicon layer pattern 106a. The tunnel oxide layer 114 may be formed on a portion of the first area I and on the preliminary polysilicon layer pattern 106a of the second area II. The tunnel oxide layer 114 may be formed using silicon oxide and/or silicon oxynitride. The tunnel oxide layer 114 may be formed by a thermal oxidation process. In example embodiments, the tunnel oxide layer 114 may be formed by the thermal oxidation process using an in-situ steam generation apparatus. In the in-situ steam generation apparatus, the substrate 100 and the preliminary polysilicon layer pattern 106a may be thermally oxidized using a reaction gas including a hydrogen gas and an oxygen gas at a temperature of about 850° C. to about 900° C. and a pressure of about 5 Torr to about 100 Torr. The tunnel oxide layer 114 may be formed on the substrate 100 and the preliminary polysilicon layer pattern 106a.

A charge trapping layer 116 may be formed on the tunnel oxide layer 114. The charge trapping layer 116 may have a thickness of about 30 Å to about 300 Å measured from an upper face of the tunnel oxide layer 114. The charge trapping layer 116 may be formed using a nitride, e.g., silicon nitride so as to ensure sufficient charge trapping sites in the charge trapping layer 116. When the charge trapping layer 116 includes silicon nitride, the charge trapping layer 116 may be formed by a CVD process, an LPCVD process and/or a plasma enhanced chemical vapor deposition (PECVD) process. In the CVD process for forming the charge trapping layer 116, the charge trapping layer 116 may be formed using a reaction gas that may include $SiH_2Cl_2$ and $NH_2$ at a temperature of about 700° C. to about 800° C. Alternatively, the charge trapping layer 116 may be formed using a reaction gas that may include $SiH_4$ and $NH_3$ at a temperature of about 250° C. to about 350° C. when the charge trapping layer 116 may be formed by the LPCVD process.

A second silicon oxide layer 118 may be formed on the charge trapping layer 116. The second silicon oxide layer 118 may serve as a reaction layer for forming an aluminum-containing tertiary metal oxide layer 124 (see FIG. 9). When the second silicon oxide layer 118 has a thickness below about 10 Å, the second silicon oxide layer 118 may not properly react with an aluminum-containing metal compound layer 120 (see FIG. 7) so that the aluminum-containing tertiary metal oxide layer 124 may not be desirably formed. When the second silicon oxide layer 118 has a thickness above about 1,000 Å, the second silicon oxide layer 118 may remain after forming the aluminum-containing tertiary metal oxide layer 124. The second silicon oxide layer 118 may have a thickness of about 10 Å to about 1,000 Å based on an upper face of the charge trapping layer 116. For example, a thickness of the second silicon oxide layer 118 may be in a range of about 30 Å to about 50 Å.

Figure 6:
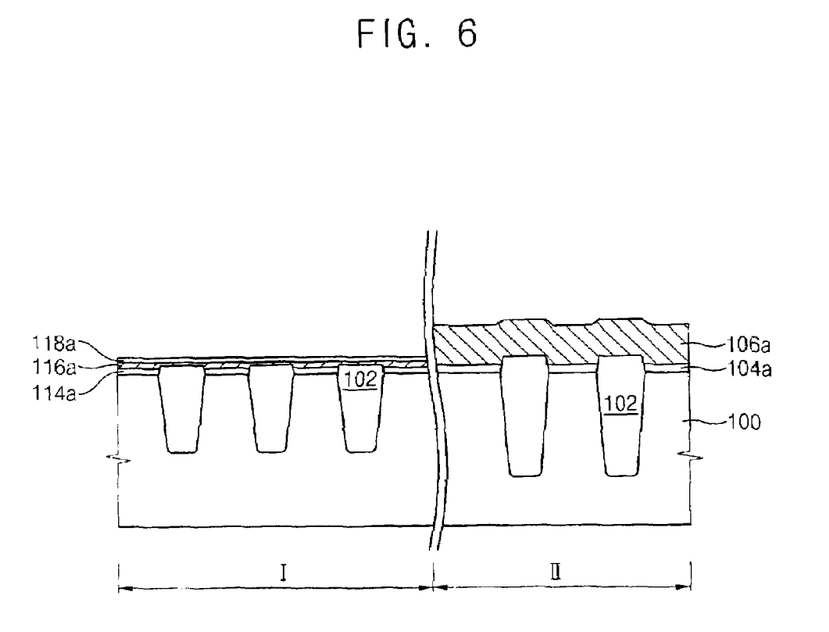

Referring to FIG. 6, a second photoresist pattern (not shown) may be formed on the second silicon oxide layer 118. The second photoresist pattern may expose a portion of the second silicon oxide layer 118 in the second area II of the substrate 100. Using the second photoresist pattern as an etching mask, the second silicon oxide layer 118, the charge trapping layer 116 and the tunnel oxide layer 114 may be partially etched to form a preliminary tunnel oxide layer pattern 114a, a preliminary charge trapping layer pattern 116a and a silicon oxide layer pattern 118a in the first area I of the substrate 100. The preliminary gate oxide layer pattern 104a and the preliminary polysilicon layer pattern 106a may be positioned in the second area II. The second photoresist pattern may be removed from the silicon oxide layer pattern 118a by an ashing process and/or a stripping process.

Figure 7:
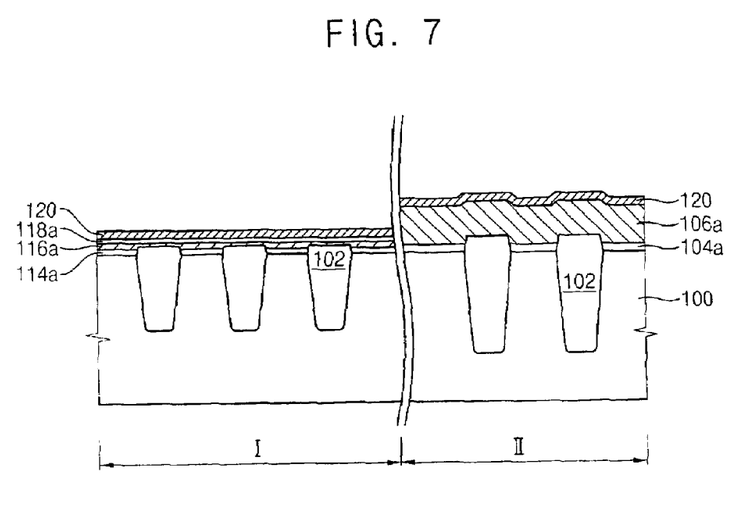

Referring to FIG. 7, the aluminum-containing metal compound layer 120 may be formed on the silicon oxide layer pattern 118a and the preliminary polysilicon layer pattern 106a. The aluminum-containing metal compound layer 120 may be formed using an aluminum-containing metal compound. For example, the aluminum-containing metal compound layer 120 may be formed using a tantalum aluminum compound, a titanium aluminum compound, a zirconium aluminum compound or a hafnium aluminum compound. These may be used alone and/or in a mixture thereof. In example embodiments, the aluminum-containing metal compound layer 120 may serve to form a dielectric layer and an ohmic layer in accordance with reaction relative to underlying layer patterns, e.g., the silicon oxide layer pattern 118a and a preliminary polysilicon layer pattern 106a.

When the aluminum-containing metal compound layer 120 has a thickness below about 10 Å, the aluminum-containing metal compound layer 120 may not properly react with the underlying layer patterns so that the dielectric layer and/or the ohmic layer may not have sufficient thickness(es). When aluminum-containing metal compound layer 120 has a thickness above about 1,000 Å, the dielectric layer and/or the ohmic layer may be irregular and undesirably thick. The aluminum-containing metal compound layer 120 may have a thickness of about 10 Å to about 1,000 Å. For example, the aluminum-containing metal compound layer 120 may have a thickness in a range of about 30 Å to about 50 Å.

In example embodiments, the aluminum-containing metal compound layer 120 may be formed by a physical vapor deposition (PVD) process. The aluminum-containing metal compound layer 120 may be formed using a target including an aluminum-containing metal compound under a plasma atmosphere. For example, the aluminum-containing metal compound layer 120 may be formed using a target including tantalum aluminum compound under a plasma atmosphere. Atoms or molecules emitted from the target may be deposited on the silicon oxide layer pattern 118a and the preliminary polysilicon layer pattern 106a, thereby forming the aluminum-containing metal compound layer 120.

Figure 8:
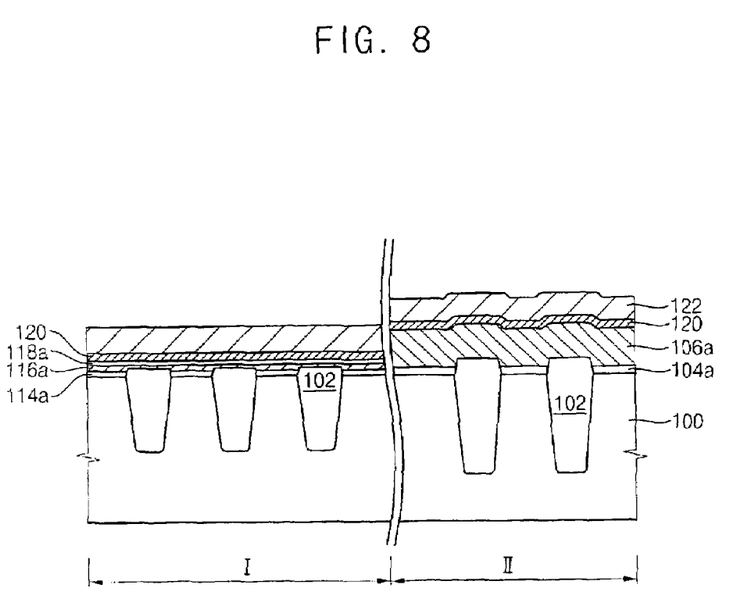

Referring to FIG. 8, an electrode layer 122 may be formed on the aluminum-containing metal compound layer 120. The electrode layer 122 may be formed using an aluminum-containing metal nitride. For example, the electrode layer 122 may be formed using tantalum aluminum nitride, titanium aluminum nitride, zirconium aluminum nitride or hafnium aluminum nitride. These may be used alone and/or in a mixture thereof.

In example embodiments, the electrode layer 122 and the aluminum-containing metal compound layer 120 may be formed in-situ. The electrode layer 122 may be formed using the target including the aluminum-containing metal compound and a nitrogen-containing gas under the plasma atmosphere. The electrode layer 122 may include tantalum aluminum nitride when the aluminum-containing metal compound layer 120 includes the tantalum aluminum compound. For example, the electrode layer 122 may be formed using the target including the tantalum aluminum compound and a nitrogen gas under the plasma atmosphere. Alternatively, the electrode layer 122 may be formed using the target including a titanium aluminum compound and a nitrogen gas under the plasma atmosphere when the aluminum-containing metal compound layer 120 includes the titanium aluminum compound.

Figure 9:
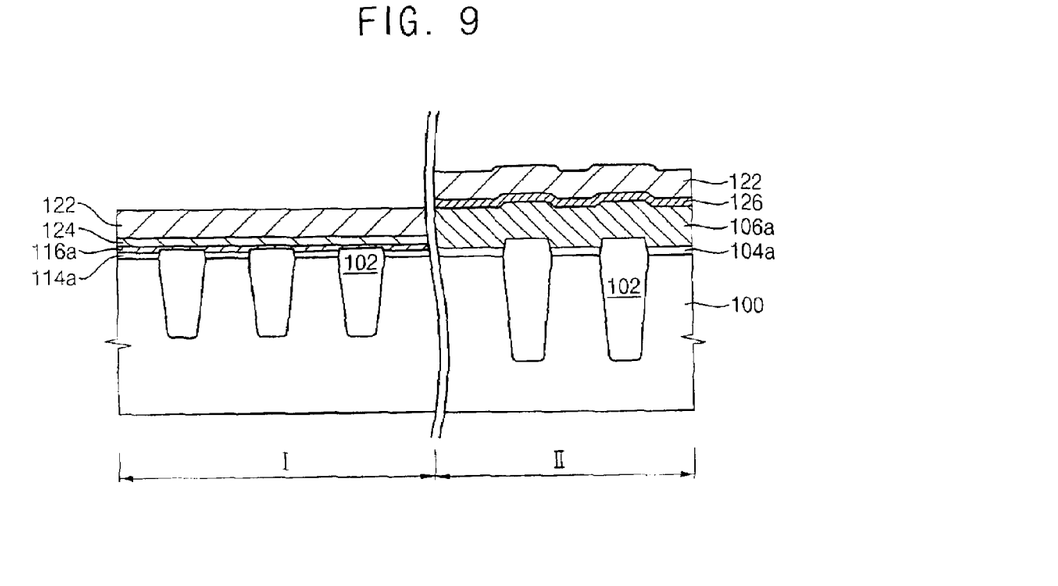

Referring to FIG. 9, the aluminum-containing tertiary metal oxide layer 124 may be formed between the preliminary charge trapping layer pattern 116a and a first portion of the electrode layer 122 in the first area I of the substrate 100. The aluminum-containing tertiary metal oxide layer 124 may be formed in accordance with the reaction between a first portion of the aluminum-containing metal compound layer 120 and the silicon oxide layer pattern 118a. Simultaneously, the aluminum-containing tertiary metal silicide layer 126 may be formed between the preliminary polysilicon layer pattern 106a and a second portion of the electrode layer 122 in the second area II of the substrate 100. The aluminum-containing tertiary metal silicide layer 126 may be formed in accordance with the reaction between a second portion of the aluminum-containing metal compound layer 120 and the preliminary polysilicon layer pattern 106a.

In example embodiments, the aluminum-containing metal oxide layer 124 and the aluminum-containing metal silicide layer 126 may be formed by a thermal treatment process performed at a temperature of about 700° C. to about 1,000° C. In example embodiments, the aluminum-containing metal oxide layer 124 and the aluminum-containing metal silicide layer 126 may be formed by a successive thermal treatment process carried out at a temperature of about 700° C. to about 1,000° C. for forming other structures of the charge trapping type non-volatile memory device. When the aluminum-containing metal compound layer 120 includes the tantalum aluminum compound, the aluminum-containing metal oxide layer 124 of tantalum aluminum oxide may be formed between the first portion of the electrode layer 122 and the preliminary charge trapping layer pattern 116a in the first area I. The aluminum-containing metal silicide layer 126 of tantalum aluminum silicide 126 may be formed between the second portion of the electrode layer 122 and the preliminary polysilicon layer pattern 106a in the second area II when the aluminum-containing metal compound layer 120 includes the tantalum aluminum compound.

When the aluminum-containing metal compound layer 120 includes the titanium aluminum compound, the aluminum-containing metal oxide layer 124 of titanium aluminum oxide may be formed between the first portion of the electrode layer 122 and the preliminary charge trapping layer pattern 116a in the first area I. In addition, the aluminum-containing metal silicide layer 126 of titanium aluminum silicide 126 may be formed between the second portion of the electrode layer 122 and the preliminary polysilicon layer pattern 106a in the second area II when the aluminum-containing metal compound layer 120 includes the titanium aluminum compound.

The aluminum-containing metal oxide layer 124 may have a dielectric constant substantially higher than that of silicon oxide so that the aluminum-containing metal oxide layer 124 may serve as the dielectric layer of the charge trapping type non-volatile memory device. The aluminum-containing metal silicide layer 126 may serve as the ohmic layer between the preliminary polysilicon layer pattern 106a and the second portion of the electrode layer 122.

Figure 10:
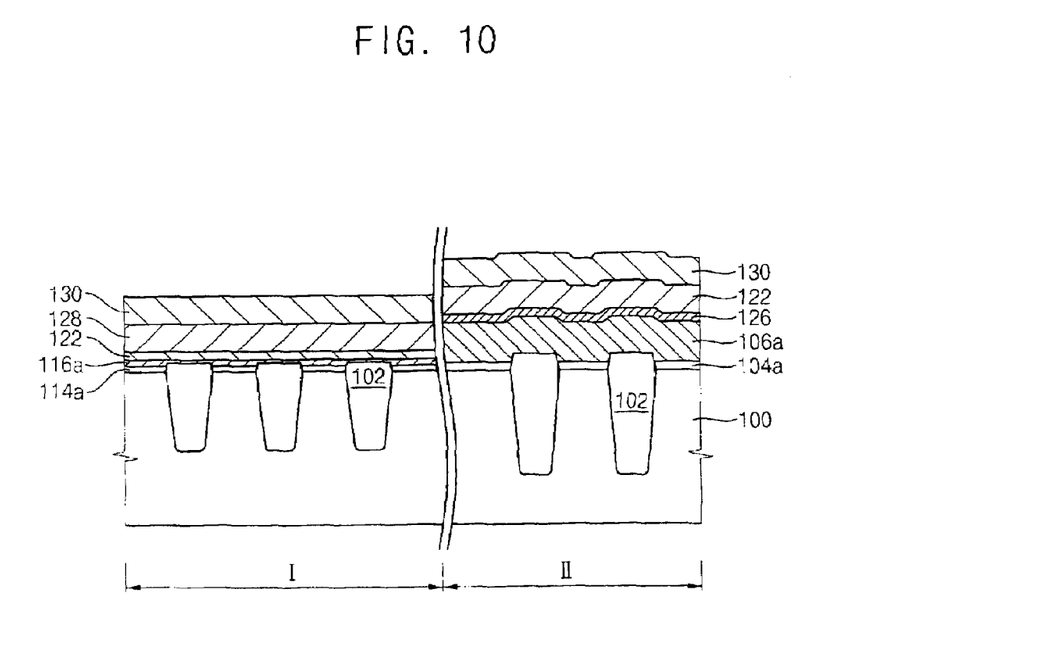

Referring to FIG. 10, an additional electrode layer 130 may be formed on the electrode layer 122. The additional electrode layer 130 may be formed using a material that may have a resistance substantially lower than that of the electrode layer 122. For example, the additional electrode layer 130 may be formed using a metal, e.g., tungsten. When the additional electrode layer 130 includes tungsten, a metal barrier layer may not be formed between the electrode layer 122 and the additional electrode layer 130 because the electrode layer 122 of the aluminum-containing tertiary metal nitride may have an increased thermal stability so as to sufficiently prevent or reduce diffusion of metal atoms from the additional electrode layer 130.

Referring to FIG. 11, a third hard mask (not shown) may be formed on the additional electrode layer 130, and then a third photoresist pattern (not shown) may be formed on the third hard mask. The third photoresist pattern may expose a first portion of the additional electrode layer 130 in the first area I of the substrate 100. Using the third hard mask and the third photoresist pattern as etching masks, the first portion of the additional electrode layer 130, the first portion of the electrode layer 122, the aluminum-containing tertiary metal oxide layer 124, the preliminary charge trapping layer 116a and the preliminary tunnel oxide layer pattern 114a may be sequentially etched.

A tunnel oxide layer pattern 114b, a charge trapping layer pattern 116b, a dielectric layer pattern 124a, a first electrode 122a and a second electrode 132 may be successively formed in the first area I. The dielectric layer pattern 124a may correspond to an aluminum-containing tertiary metal oxide layer pattern. A charge trapping structure in the first area I may include the tunnel oxide layer pattern 114b, the charge trapping layer pattern 116b and the dielectric layer pattern 124a. The third photoresist pattern may be removed from the third hard mask by an ashing process and/or a stripping process.

Referring to FIG. 12, a fourth photoresist pattern (not shown) may be formed on the third hard mask. The fourth photoresist pattern may expose a second portion of the additional electrode layer 130 in the second area II. The second portion of the additional electrode layer 130, the second portion of the electrode layer 122, the aluminum-containing tertiary metal silicide layer 126, the preliminary polysilicon layer pattern 106a and the preliminary gate oxide layer pattern 104a may be successively etched. A gate oxide layer pattern 104a, a polysilicon layer pattern 106a, an ohmic layer pattern 126a, a lower electrode 122b and an upper electrode 134 may be sequentially formed in the second area II of the substrate 100. The ohmic layer pattern 126a corresponds to an aluminum-containing tertiary metal silicide layer pattern. A gate structure in the second area II may include the gate oxide layer pattern 104a, the polysilicon layer pattern 106a and the ohmic layer pattern 126a. The fourth photoresist pattern may be removed from the third hard mask by an ashing process and/or a stripping process. The third hard mask may be removed through a wet etching process and/or a dry etching process.

In example embodiments, the gate structure, the lower electrode 122b and the upper electrode 134 may be formed in the second area II of the substrate 100 before forming the charge trapping structure, the first electrode 122a and the second electrode 132 in the first area I of the substrate 100. The first and the second impurity regions 136a and 136b (see FIG. 2) may be formed on first and second portions of the substrate 100. The first impurity regions 136a may be formed on the first portion of the substrate 100 adjacent to the charge trapping structure in the first area I, whereas the second impurity regions 136b may be formed on the second portions of the substrate 100 adjacent to the gate structure in the second area II.

In example embodiments, the dielectric layer pattern 124a and the ohmic layer pattern 126a may be simultaneously formed in the first and the second areas I and II in accordance with the reaction between the aluminum-containing metal compound layer 120 and the underlying layer patterns. Manufacturing processes for the charge trapping type non-volatile memory device may be simplified. The dielectric layer pattern 124a may include the aluminum-containing tertiary metal oxide having the higher dielectric constant, thereby improving electrical characteristics of the charge trapping type non-volatile memory device.

According to example embodiments, a dielectric layer pattern of a charge trapping structure in a cell area may be simultaneously formed with an ohmic layer pattern of a gate structure in a peripheral circuit area. The dielectric layer pattern of an aluminum-containing tertiary metal oxide may have a higher dielectric constant, and the ohmic layer pattern of an aluminum-containing tertiary metal silicide may have improved thermal stability, thereby enhancing programming and erasing operations of a charge trapping type non-volatile memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a semiconductor memory device, comprising:
    forming a preliminary tunnel oxide layer pattern, a preliminary charge trapping layer pattern and a silicon oxide layer pattern in a first area of a substrate;
    forming a preliminary gate oxide layer pattern and a preliminary polysilicon layer pattern in a second area of the substrate;
    forming an aluminum-containing metal compound layer on the silicon oxide layer pattern and the preliminary polysilicon layer pattern;
    forming an electrode layer on the aluminum-containing metal compound layer;
    forming an aluminum-containing tertiary metal oxide layer between the preliminary charge trapping layer pattern and the electrode layer by reacting a first portion of the aluminum-containing metal compound layer with the silicon oxide layer pattern;
    forming an aluminum-containing tertiary metal silicide layer between the preliminary polysilicon layer pattern and the electrode layer by reacting a second portion of the aluminum-containing metal compound layer with the preliminary polysilicon layer pattern;
    forming a charge trapping structure and a first electrode in the first area by patterning a first portion of the electrode layer, the aluminum-containing tertiary metal oxide layer, the preliminary charge trapping layer pattern and the preliminary tunnel oxide layer pattern, wherein the charge trapping structure includes a tunnel oxide layer pattern, a charge trapping layer pattern and a dielectric layer pattern; and
    forming a gate structure and a lower electrode in the second area by patterning a second portion of the electrode layer, the aluminum-containing tertiary metal silicide layer, the preliminary polysilicon layer pattern and the preliminary gate oxide layer pattern, wherein the gate structure includes a gate oxide layer pattern, a polysilicon layer pattern and an ohmic layer pattern.

2. The method of claim 1, wherein the silicon oxide layer pattern has a thickness of about 10 Å to about 1,000 Å.

3. The method of claim 1, wherein forming the aluminum-containing metal compound layer includes forming the aluminum-containing metal compound layer of at least one compound selected from the group consisting of a tantalum aluminum compound, a titanium aluminum compound, a zirconium aluminum compound and a hafnium aluminum compound.

4. The method of claim 1, wherein forming the aluminum-containing metal compound layer includes forming the aluminum-containing metal compound layer with a thickness of about 10 Å to about 1,000 Å.

5. The method of claim 1, wherein forming the aluminum-containing metal compound layer and forming the electrode layer are carried out in-situ.

6. The method of claim 1, wherein forming the aluminum-containing metal compound layer includes forming the aluminum-containing metal compound layer by a physical vapor deposition (PVD) process.

7. The method of claim 1, wherein forming the electrode layer includes forming an aluminum-containing metal nitride.

8. The method of claim 7, wherein forming the electrode layer includes using a target including an aluminum-containing metal compound and a nitrogen-containing gas under a plasma atmosphere.

9. The method of claim 7, wherein forming the electrode layer includes forming at least one compound selected from the group consisting of tantalum aluminum nitride, titanium aluminum nitride, zirconium aluminum nitride and hafnium aluminum nitride.

10. The method of claim 1, wherein forming the aluminum-containing tertiary metal oxide layer and forming the aluminum-containing tertiary metal siicide layer are simultaneously performed.

11. The method of claim 10, wherein forming the aluminum-containing tertiary metal oxide layer and forming the aluminum-containing tertiary metal siicide layer includes performing a thermal treatment at a temperature of about 700° C. to about 1,000° C.

12. The method of claim 1, further comprising:

forming an additional electrode layer on the first electrode and the lower electrode using a metal that has a resistance substantially lower than that of the electrode layer; and forming a second electrode on the first electrode and simultaneously forming an upper electrode on the lower electrode by patterning the additional electrode layer.

13. The method of claim 12, wherein the additional electrode layer includes tungsten.

14. The method of claim 1, further comprising:

forming first impurity regions on portions of the first area adjacent to the charge trapping structure; and forming second impurity regions on portions of the second area adjacent to the gate structure.

* * * * *